United States Patent
Goodwin

(10) Patent No.: US 6,625,512 B1
(45) Date of Patent: Sep. 23, 2003

(54) METHOD AND APPARATUS FOR PERFORMING FINAL CRITICAL DIMENSION CONTROL

(75) Inventor: Greg Goodwin, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 270 days.

(21) Appl. No.: 09/625,140

(22) Filed: Jul. 25, 2000

(51) Int. Cl.[7] .............................................. G06F 19/00
(52) U.S. Cl. ...................................... 700/121; 382/141
(58) Field of Search .............................. 700/121, 117, 700/123; 438/14, 5, 7–9, 16; 382/141

(56) References Cited

U.S. PATENT DOCUMENTS

| | | | |
|---|---|---|---|
| 5,629,772 A | 5/1997 | Ausschnitt | 356/372 |
| 5,885,884 A * | 3/1999 | Jan et al. | 438/482 |
| 5,913,102 A | 6/1999 | Yang | 438/14 |
| 5,926,690 A * | 7/1999 | Toprac et al. | 438/17 |
| 6,055,460 A * | 4/2000 | Shopbell | 700/121 |
| 6,144,897 A * | 11/2000 | Selliers | 700/269 |
| 6,161,054 A * | 12/2000 | Rosenthal et al. | 700/121 |
| 6,263,255 B1 * | 7/2001 | Tan et al. | 700/121 |
| 6,388,253 B1 * | 5/2002 | Su | 250/310 |

FOREIGN PATENT DOCUMENTS

WO 01/50521 7/2001 .......... H01L/21/66

OTHER PUBLICATIONS

International Search Report dated Nov. 7, 2002 for International application No. PCT/US01/22544 Filed Jul. 18, 2001.

* cited by examiner

*Primary Examiner*—Leo Picard
*Assistant Examiner*—Zoilo E. Cabrera
(74) *Attorney, Agent, or Firm*—Williams, Morgan & Amerson, P.C.

(57) ABSTRACT

The present invention provides for a method and an apparatus for control of final critical dimensions during processing of semiconductor wafers. A manufacturing run of semiconductor devices is processed. Metrology data from the processed semiconductor devices is acquired. A final critical dimension control adjustment process is performed using the acquired metrology data. A feedback/feed-forward modification process is performed in response to the final critical dimension control adjustment process.

31 Claims, 8 Drawing Sheets

METHOD AND APPARATUS FOR PERFORMING FINAL CRITICAL DIMENSION CONTROL

BACKGROUND OF THE INVENTION

1. Field of the Invention

This invention relates generally to semiconductor manufacturing, and, more particularly, to a method and apparatus for automated error correction of final critical dimensions in semiconductor wafers.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and, therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the factors that affect semiconductor device manufacturing are wafer-to-wafer variations that are caused by manufacturing problems that include start-up effects of manufacturing factoring machine tools, memory effects of manufacturing chambers, first-wafer effects, and mismatching of process modules in-manufacturing equipment. One of the process steps that is adversely affected by such factors is the photolithography critical dimension formation. Critical dimension control is one of several important steps in the photolithography area of semiconductor manufacturing. Critical dimension control involves measuring the desired critical circuit feature size compared to the actual circuit feature size on the surface of a semiconductor device. Generally, minimization of misalignment errors is important to ensure that the multiple layers of the semiconductor devices are connected and functional. As technology facilitates smaller critical dimensions for semiconductor devices, the need for the reduction of misalignment errors increases dramatically.

Generally, process engineers currently analyze the process errors a few times a month. The results from the analysis of the process errors are used to make updates to process tool settings manually. Generally, a manufacturing model is employed to control the manufacturing processes. Some of the problems associated with the current methods include the fact that the process tool settings are only updated a few times a month. Furthermore, currently, the process tool updates are generally performed manually. Many times, errors in semiconductor manufacturing are not organized and reported to quality control personnel. Often, the manufacturing models themselves incur bias errors that could compromise manufacturing quality. Proper formation of sub-sections within a semiconductor device is important in proper performance of the manufactured semiconductor device. Critical dimensions of the sub-sections, such as polysilicon gates, generally have to be within a predetermined acceptable margin of error for semiconductor devices to be within acceptable manufacturing quality.

Generally, a set of processing steps is performed on a lot of wafers on a semiconductor manufacturing tool called an exposure tool or a stepper or a scanner, followed by processing of the semiconductor wafers in etch tools. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Many times, errors can occur during the processing of semiconductor devices. These errors can cause appreciable inconsistencies in the critical dimensions of multiple parameters in the processed semiconductor devices. Furthermore, it is important to reduce errors to cause the critical dimensions, particularly the final critical dimensions, of the parameters of the processed semiconductor device to be within acceptable tolerance margins.

The present invention is directed to overcoming, or at least reducing the effects of, one or more of the problems set forth above.

SUMMARY OF THE INVENTION

In one aspect of the present invention, a method is provided for control of final critical dimensions during processing of semiconductor wafers. A manufacturing run of semiconductor devices is processed. Metrology data from the processed semiconductor devices is acquired. A final critical dimension control adjustment process is performed using the acquired metrology data. A feedback/feed-forward modification process is performed in response to the final critical dimension control adjustment process.

In another aspect of the present invention, a system is provided for control of final critical dimensions during processing of semiconductor wafers. The system of the present invention comprises: a metal deposition process tool capable of depositing a metal substance upon a surface of a semiconductor wafer; a photolithography tool capable of defining metal lines upon the surface of the semiconductor wafer; an etch process tool capable of etching excess material resulting from processing of the semiconductor wafer by the photolithography tool; at least one machine interface electronically coupled to each of the metal deposition process tool, the photolithography tool, and the etch process tool, wherein the machine interface is capable of sending at least one control input parameter to each of the metal deposition process tool, the photolithography tool, and the etch process tool; a computer system electronically coupled to the machine interface, the computer system being capable of controlling the machine interface; at least one metrology tool coupled with each of the metal deposition process tool, the photolithography tool, and the etch process tool, the metrology tool being capable of acquiring metrology data; and a final critical dimension control algorithm unit coupled with the metrology tool and the computer system, the final critical dimension control algorithm unit being capable of causing the computer system to modify at least one control input parameter in response to the metrology data.

BRIEF DESCRIPTION OF THE DRAWINGS

The invention may be understood by reference to the following description taken in conjunction with the accompanying drawings, in which like reference numerals identify like elements, and in which.

Figure 1:
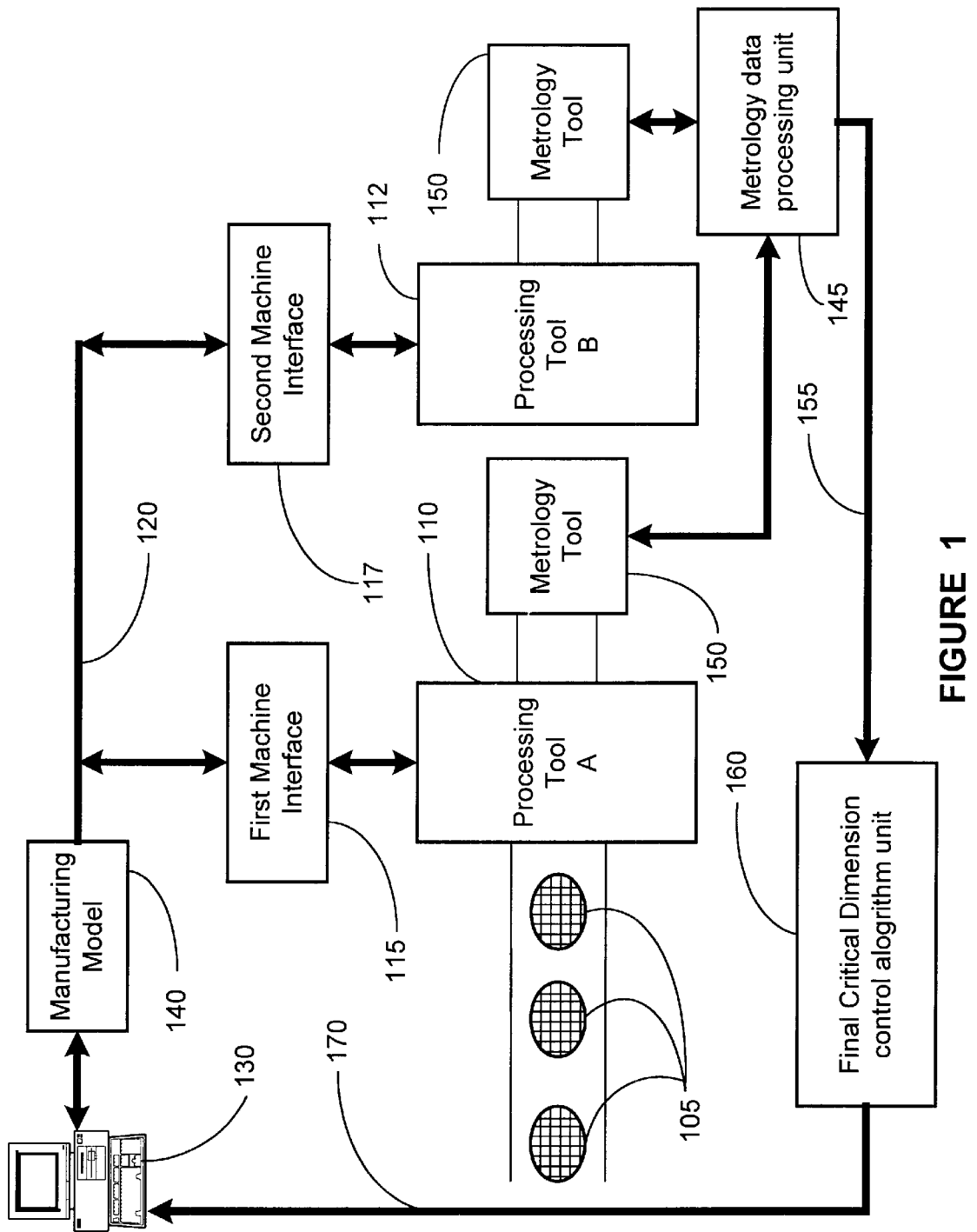
FIG. 1 illustrates one embodiment of the method taught by the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Wafer-to-wafer variations can result in an output of non-uniform semiconductor devices. One process that is affected is the photolithography critical dimension process. Critical dimension formation is an important step in semiconductor manufacturing. In particular, critical dimension formation involves measuring desired critical dimensions compared to actual critical dimensions on semiconductor layers during manufacturing processes. Improvements in the critical dimension process could result in substantial enhancements, in terms of quality and efficiency, in semiconductor manufacturing processes. The present invention provides a method of implementing automated error correction for wafer-to-wafer variations.

Semiconductor devices are processed in a manufacturing environment using a number of input control parameters. Turning now to FIG. 1, one embodiment of the present invention is illustrated. In one embodiment, semiconductor products 105, such as semiconductor wafers, are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces faces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. In one embodiment, the manufacturing model 140 contains a recipe that determines a plurality of control input parameters that are sent on the line 120.

In one embodiment, the manufacturing model 140 defines a process script and input control that implement a particular manufacturing process. The control input signals on a line 120 that are intended for the processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are metal deposit tools, steppers, scanners, step-and-scan tools, and etch process tools.

One or more of the semiconductor wafers 105 that are processed by the processing tools 110, 112 are generally sent to a metrology tool 150 for acquisition of metrology data. In one embodiment, the metrology tool 150 is a metal deposition process data acquisition tool. In another embodiment, the metrology tool 150 is a photolithography process data acquisition tool. In yet another embodiment, the metrology tool 150 is an etch process data acquisition, tool. Data from the metrology tool 150 is processed and organized by the metrology data processing unit 145. In one embodiment, the metrology data processing unit 145 correlates the metrology data to a particular manufacturing lot of processed semiconductor wafers. In one embodiment, the metrology data processing unit 145 is integrated into the computer system 130. In one embodiment, the metrology data processing unit 145 is a computer software program embedded into the computer system. 130, wherein the computer system 130 is integrated within an APC framework.

The processed metrology data from the metrology data processing unit 145 is sent to a final critical dimension control algorithm unit 160 on a line 155. In one embodiment, the final critical dimension control algorithm unit 160 utilizes the metrology data and performs a final critical dimension control adjustment process. The final critical dimension control adjustment data generated by the final critical dimension control algorithm unit 160 is sent to the computer system 130 via a line 170. The final critical dimension control adjustments from the final critical dimension control algorithm unit 160 are used to generate feedback and feed-forward adjustment data that are known by those skilled in the art. The computer system 130 utilizes the feedback and feed-forward adjustment data to make modifications in the manufacturing model 140, which causes appropriate changes in the control input parameters on the line 120. In one embodiment, the final critical dimension control algorithm unit 160 is integrated into the computer system 130. In one embodiment, the final critical dimension control algorithm unit 160 is a computer software program embedded into the computer system 130.

Generally, the feedback modification of the control input signals on the line 120 are performed on photolithography processes, such as line-width adjustments using photo exposure dosages and line profile adjustments using exposure focus modifications. Feedback modification of the control input signal on the line 120 can also be performed on etch processes, such as etch line shape adjustments using etch recipe modifications and etch endpoint adjustments. Feedback and feed-forward adjustments are made in order to reduce the errors in the final critical dimensions of the processed semiconductor wafers.

In the context of a manufacturing process, such as a stepper process, the control inputs on the line 120 that are used to operate the processing tool 110 include an exposure dose signal, a focus offset signal, a numerical aperture signal, a partial coherence signal, and a wafer stage height signal. Generally, errors associated with the exposure dose signal and the focus offset signal relate to one particular exposure process on the surface of the wafer being processed in the exposure tool. One of the primary features taught by the present invention is a method of updating control input signals on the line 120 in response to an analysis of external variables.

When a process step in the processing tool 110 is concluded, the semiconductor wafer 105 that is being processed in the processing tool 110 is examined in a review station. One such review station is a KLA review station. One set of data derived from the operation of the review station is a quantitative measure of the critical dimension error (CD error) that was caused by the previous exposure process. In one embodiment, the amount of CD error relates to the over-exposure or under-exposure in the process that occurred on the current layer of a semiconductor wafer. In one embodiment, the amount of CD error that occurred can be attributed to the control inputs to a particular exposure process. The control inputs generally affect the accuracy of the process steps performed by the exposure tools on the semiconductor wafer. The control input signals affect the measured critical dimension and the position of the semiconductor wafer that is being processed. Modifications of the control inputs can be utilized to improve the performance of the process steps employed in the exposure tool. In one embodiment, the modifications to the control input signals on the line 120 are based on the effects of external variables on the semiconductor devices being processed.

Figure 2:
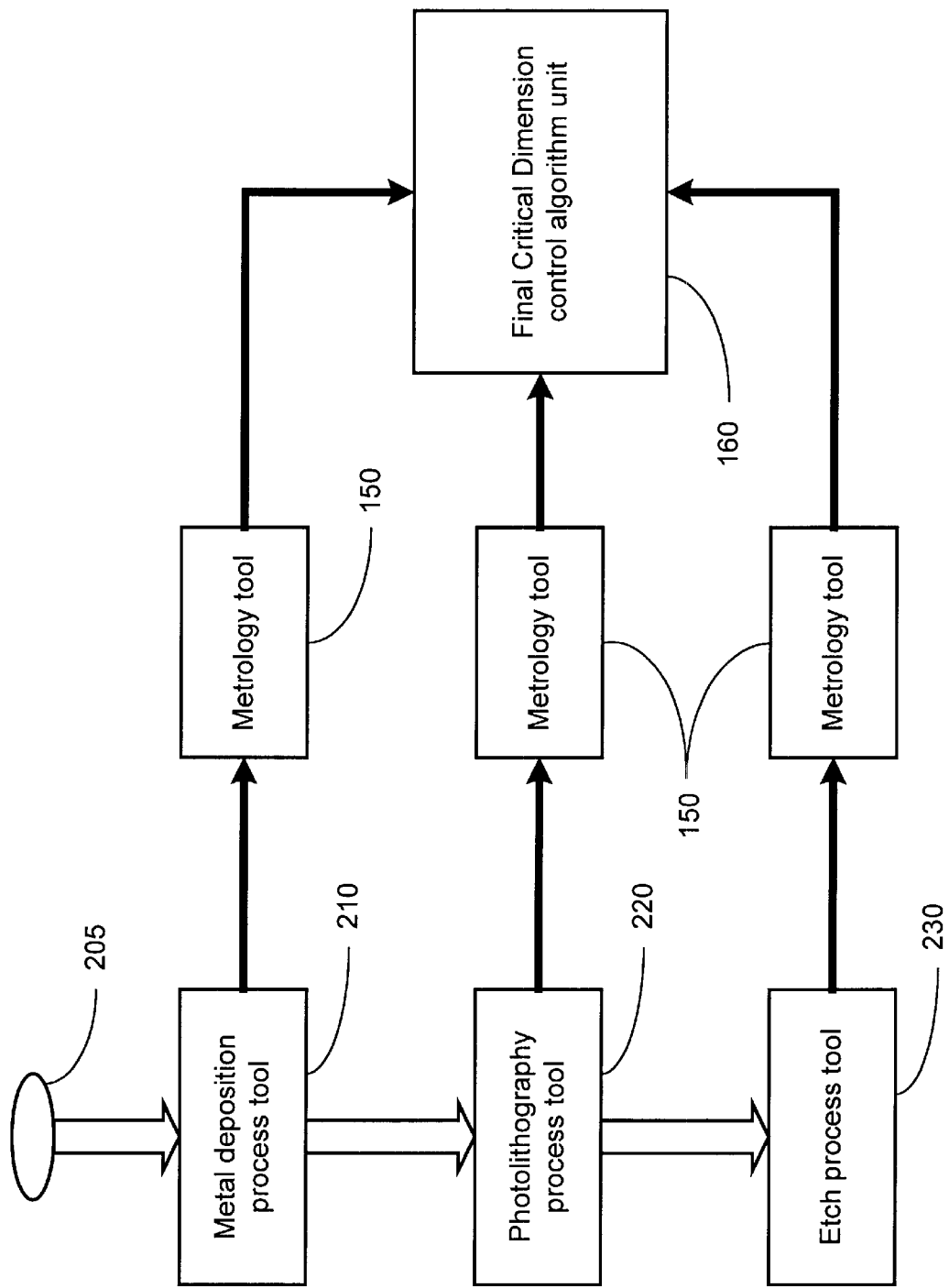
FIG. 2 illustrates a simplified diagram of a processing line for performing the methods taught by the present invention.

Turning now to FIG. 2, a block diagram representation of a more detailed embodiment of the apparatus used to implement the teaching of the present invention is illustrated. A wafer 205, such as a semiconductor wafer, is sent to a metal deposition process tool 210. The metal deposition process tool 210 deposits at least one layer of a metal, such as aluminum, onto the surface of the wafer 205. Manufacturing data, or metrology data, that results from the metal deposition process is acquired by the metrology tool 150. The metal deposition process metrology data is then sent to the final critical dimension control algorithm unit 160.

The wafer 205 is then sent to the photolithography process tool 220 for photolithography processing, such as patterning metal lines on the wafer 205. Metrology data that results from the photolithography process is acquired by the metrology tool 150. The metrology data acquired by the metrology tool 150 associated with the photolithography process tool 220 may comprise data such as CD error. The photolithography process metrology data is then sent to the final critical dimension control algorithm unit 160. Subsequently, the wafer 205 is sent to the etch process tool 230 for etch processing. In one embodiment, the etch process comprises a reactive ion etching stage. Metrology data that results from the etch process is acquired by the metrology tool 150. The metrology data acquired by the metrology tool 150 associated with the etch process tool 230 may comprise data such as the final critical dimensions of the line-width thickness of the metal lines on the wafer 205. The etch process metrology data is then sent to the final critical dimension control algorithm unit 160 for further analysis.

Figure 3:
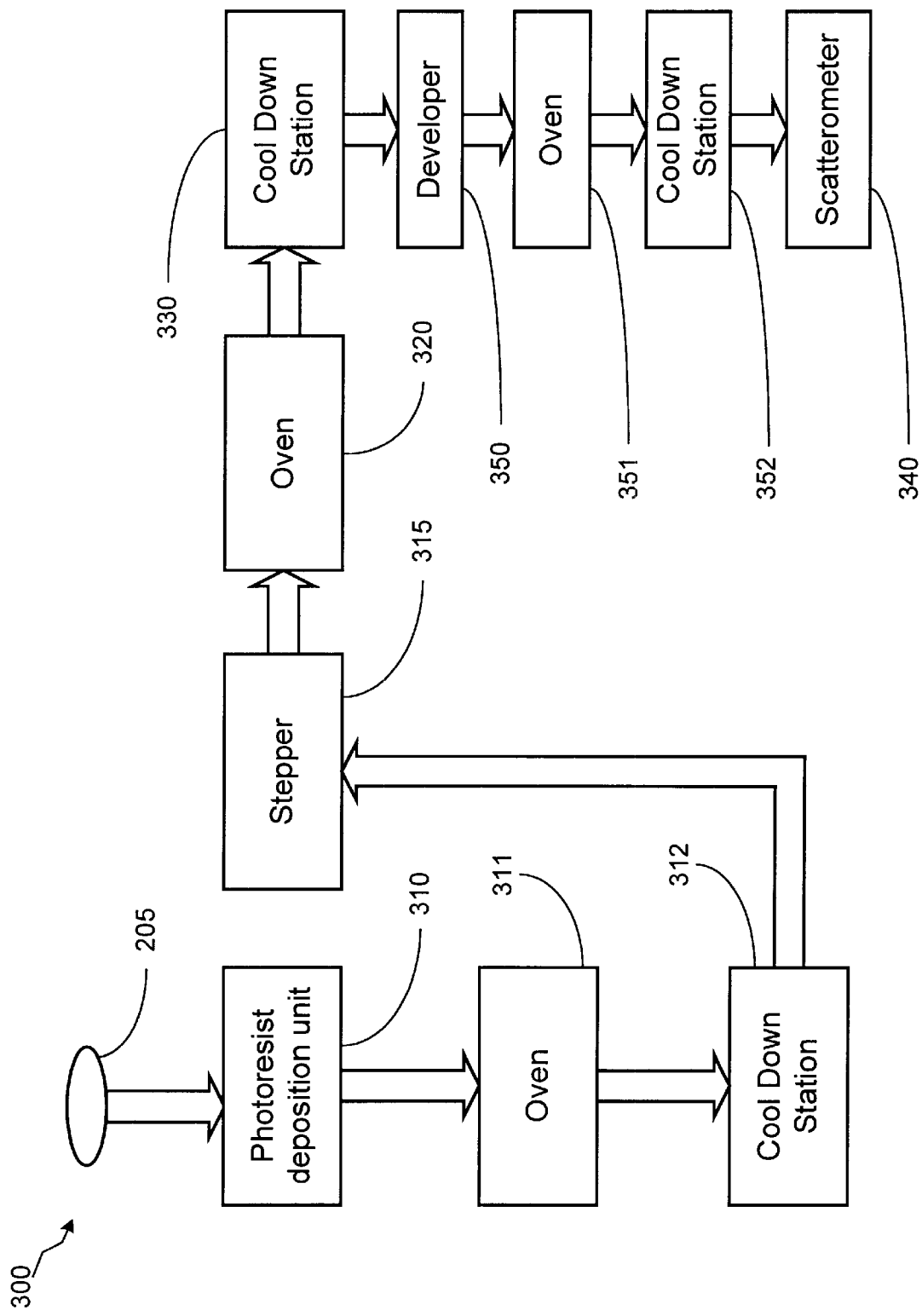
FIG. 3 illustrates a simplified diagram of a processing line for performing photolithography patterning.

Referring now to FIG. 3, a simplified diagram of an illustrative processing line 300 for performing photolithography patterning is depicted. The processing line 300 includes a photoresist deposition unit 310, a stepper 315, three ovens 311, 320, 351, three cool down stations 312, 330, 352, a developer 350, and a metrology tool, such as a scatterometer 340. The photoresist deposition unit 310 receives the wafer 205, and deposits a predetermined thickness of photoresist material upon the surface of the wafer 205. The wafer 205 is then sent to the oven 311 for thermal processing. Subsequently, the wafer 205 is sent to the cool down station 312 for cooling before being sent to the stepper 315. The stepper 315 then receives the wafer 205 (or lot of semiconductor wafers) and exposes the wafer 205 to a light source using a reticle to pattern the wafer 205. The wafer 205 is transferred to the oven 320, where a post-exposure bake is conducted. Following the post-exposure bake, the wafer 205 is transferred to the cool down station 330, and then to the developer 350 after the wafer 205 has sufficiently cooled. The developer 350 removes exposed photoresist material from the wafer 205. The wafer 205 is then sent to the oven 351 for thermal processing and the wafer 205 is cooled in the cool down station 352.

The wafer 205 is then transferred to the scatterometer 340 for measurements. As described in greater detail below, the scatterometer 340 measures the wafer 205 to determine the acceptability and/or uniformity of the previously performed photolithography processes and conveys wafer measurements to the final critical dimension control algorithm unit 160. The computer system 130, which is integrated with the APC framework, based on the wafer measurements, adjusts the recipe of the stepper 315, if needed. As will be recognized by those of ordinary skill in the art in light of this disclosure, the processing line 300 may include discrete or integrated processing tools for performing the processing steps described herein. The data acquired by the scatterometer 340 is used for performing feedback and feed-forward modifications of the control input signals on the line 120, which control the processing tools 110, 112. The final critical dimension control algorithm unit 160 acquires metrology data from the photolithography process described in FIG. 3, and generates control adjustments that affect subsequent photolithography processing of semiconductor wafers.

Figure 4:
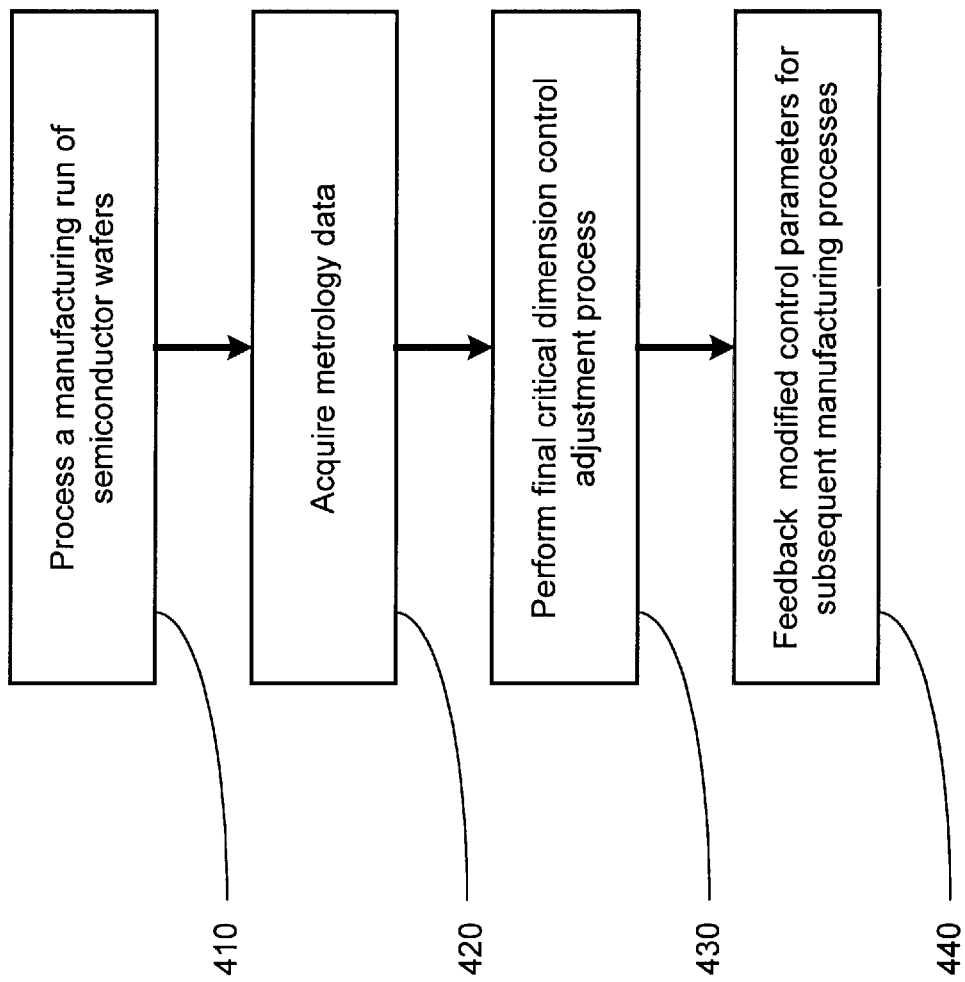
FIG. 4 illustrates a flowchart representation of the methods taught by the present invention.

Turning now to FIG. 4, a flowchart representation of one embodiment of the methods taught by the present invention is illustrated. A manufacturing run of semiconductor wafers is processed, as described in block 410 of FIG. 4. Metrology data that results from the processing of semiconductor wafers is acquired by at least one metrology tool, as described in block 420 of FIG. 4. A more detailed description of the steps of processing semiconductor wafers and acquiring the resultant metrology data, described in blocks 410 and 420 of FIG. 4, is illustrated in FIG. 5.

Figure 5:
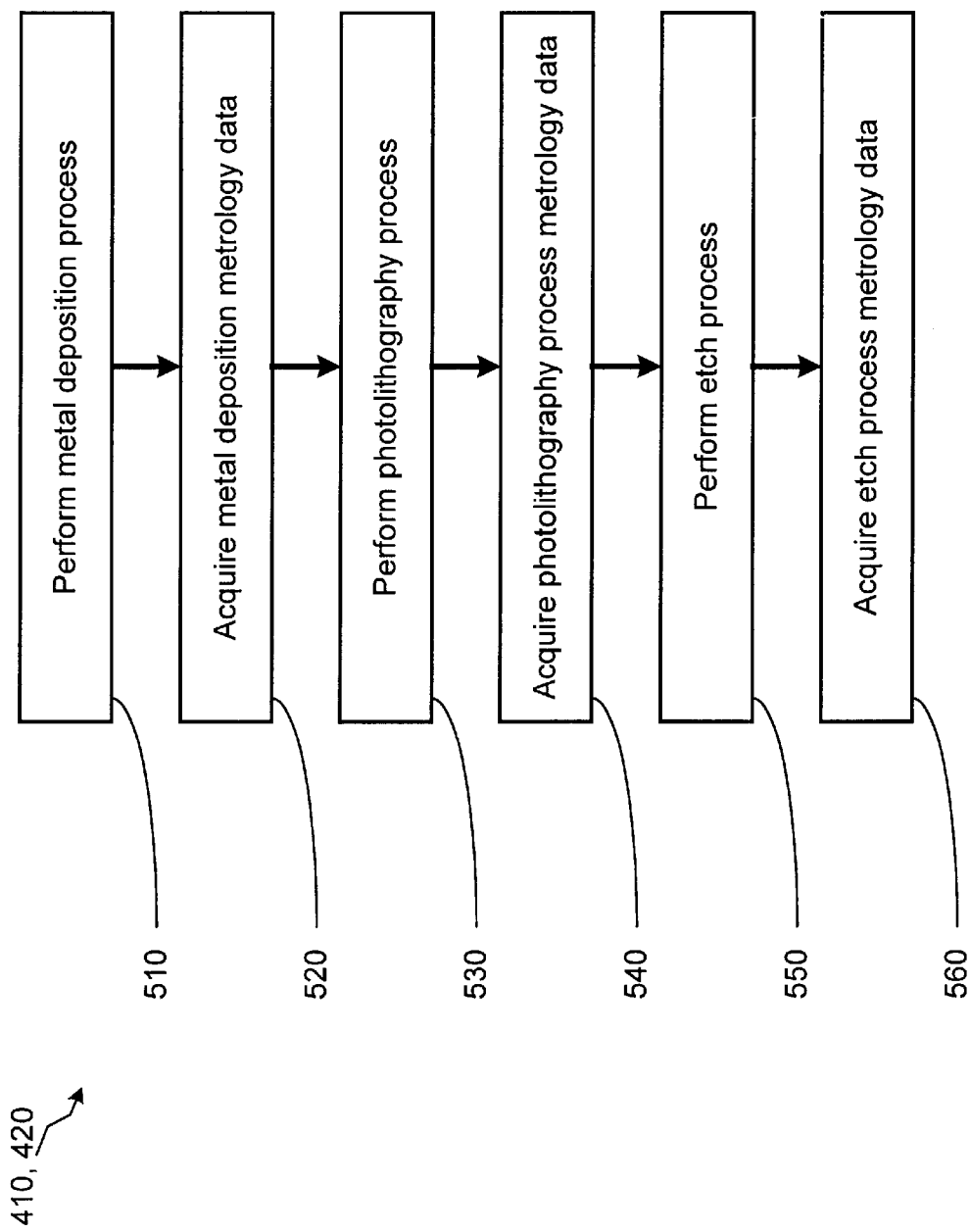
FIG. 5 illustrates, in further detail, a flowchart representation of performing the steps of processing semiconductor wafers and acquiring metrology data, as described in FIG. 4.

Turning now to FIG. 5, a metal deposition process is performed on at least one semiconductor wafer, as described in block 510. In one embodiment, the metal deposition process comprises an aluminum deposition stage, as known by those skilled in the art and having the benefit of the present disclosure. Metrology data reflecting the accuracy of the metal deposition process is acquired by a metrology tool, as described in block 520 of FIG. 5. The acquired metrology data from the metal deposition process may comprise data such as the thickness of the deposited metal, the sheet resistivity of the deposited metal, and the top reflectivity of the deposited metal.

After the metal deposition process, a photolithography process is performed on the semiconductor wafers, as described in block 530 of FIG. 5. The photolithography process comprises generating metal line patterning on the semiconductor wafers. Once the photolithography process is performed on the semiconductor wafers, the associated metrology data is acquired, as described in block 540 of FIG. 5. The acquired metrology data includes line profile, circuit critical dimension, slope, and the like, associated with a particular photo dosage. Subsequently, an etch processing step is performed on the semiconductor wafers, as described in block 550 of FIG. 5. In one embodiment, a reactive ion etch process is used to etch aluminum material from the semiconductor wafers. Metrology data resultant from the etch process is acquired, as described in block 560 of FIG. 5. The acquired metrology data may comprise data such as the metal line thickness associated with a particular etch endpoint time.

Turning back to FIG. 4, once a manufacturing lot of semiconductor wafers are processed and the associated metrology data is acquired, a final critical dimension control adjustment process is performed, as described in block 430 of FIG. 4. A more detailed embodiment of the step of performing a final critical dimension control adjustment process is illustrated in FIG. 6.

Figure 6:
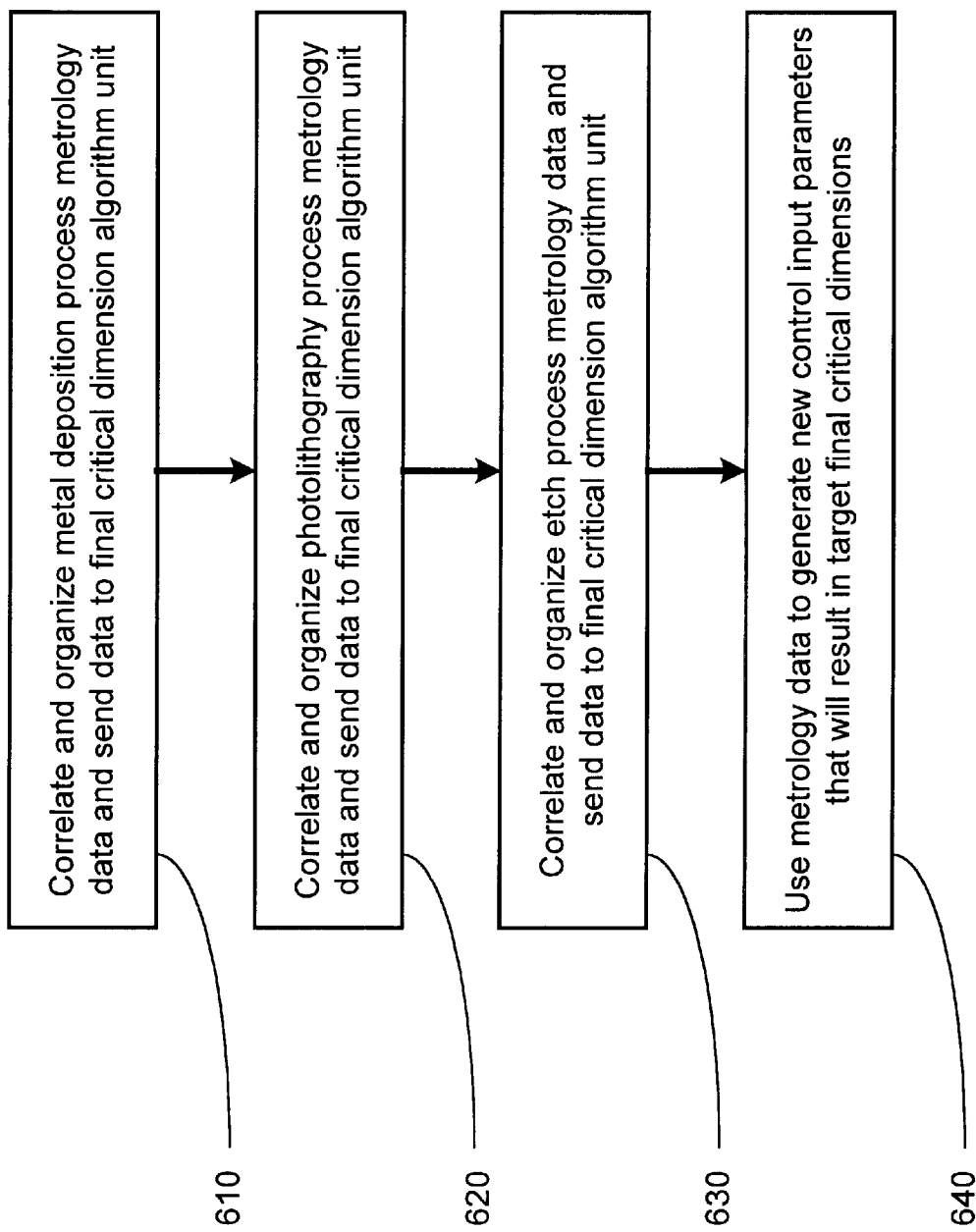
FIG. 6 illustrates, in further detail, a flowchart representation of the steps for performing the final critical dimension control adjustment process, as described in FIG. 4.

Turning now to FIG. 6, metal deposition process metrology data is correlated and organized in relation to particular manufacturing lots of semiconductor wafers, and are then sent to the final critical control dimension algorithm unit 160, as described in block 610. The metal deposition process metrology data may comprise data such as the thickness of the deposited metal, the sheet resistivity of the deposited metal, and the top reflectivity of the deposited metal. The photolithography process metrology data is correlated and organized in relation to particular manufacturing lots of semiconductor wafers, and are then sent to the final critical dimension control algorithm unit 160, as described in block 620 of FIG. 6. The photolithography process metrology data may comprise data such as the line profile, circuit critical dimension, slope, and the like, associated with a particular photo dosage. Subsequently, the etch process metrology data is correlated and organized in relation to particular manufacturing lots of semiconductor wafers, and are then sent to the final critical dimension control algorithm unit 160, as described in block 630 of FIG. 6. The etch process metrology data may comprise data such as the metal line thickness associated with a particular etch endpoint time.

Figure 7:
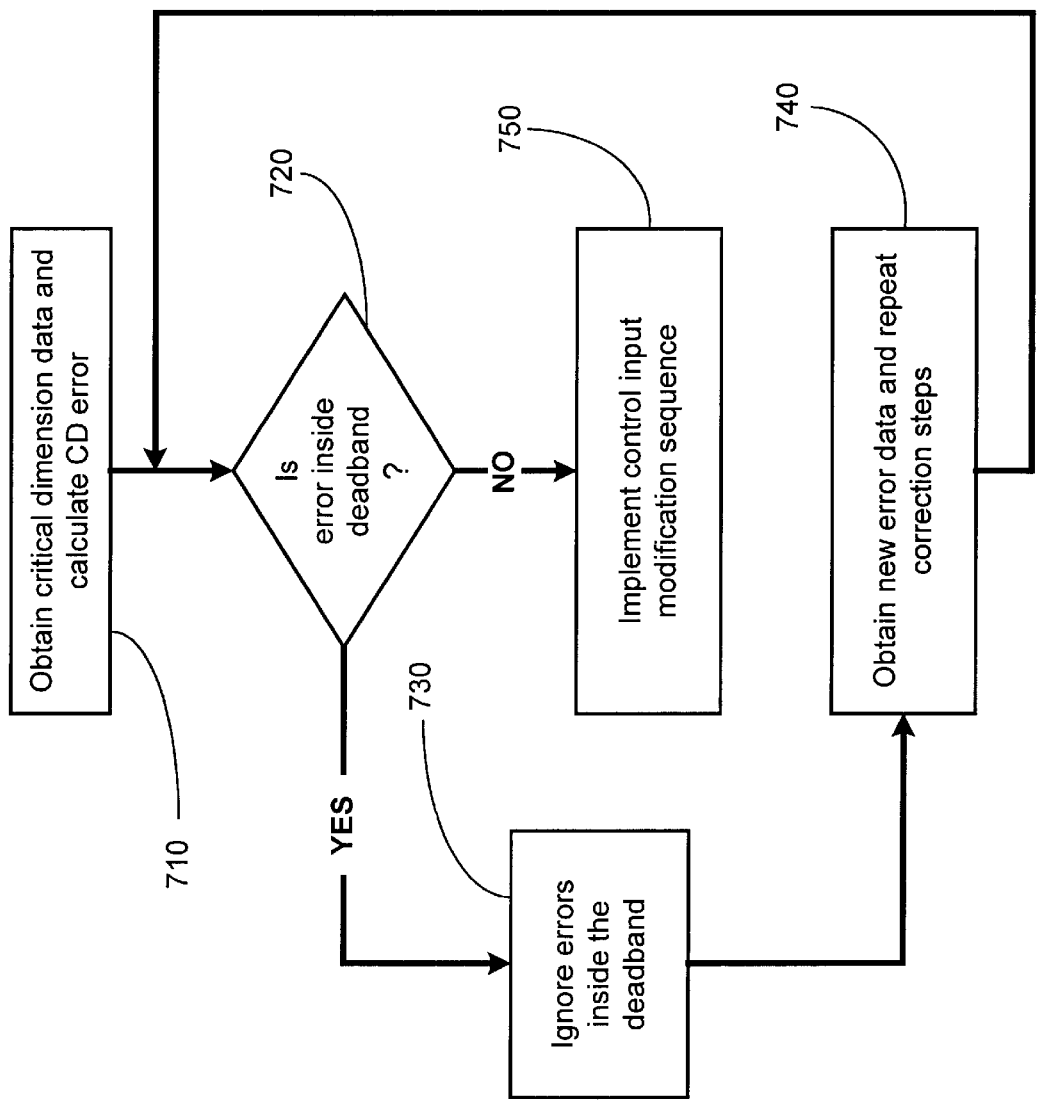
FIG. 7 illustrates a flowchart representation of one embodiment of performing control input parameter modifications.

The final critical dimension control algorithm unit 160 then calculates the final critical dimensions of the processed semiconductor wafers and uses the metrology data to formulate modified control input parameters in order to reduce errors in the final critical dimensions and approach a target final critical dimension, as described in block 640 of FIG. 6. The metrology data that is used by the final critical dimension control algorithm unit 160 may comprise data such as the thickness of the deposited metal, the sheet resistivity of the deposited metal, the top reflectivity of the deposited metal, the misregistration, line thickness, and the like, associated with a particular photo dosage, and the metal line thickness associated with a particular etch endpoint time. The final critical dimension control algorithm unit 160 makes a determination to modify the control input parameter of subsequent processes steps, such as adjusting the photo dosage for photolithography processes and the endpoint time for etch processes, based upon the amount of error detected in the final critical dimension. FIG. 7 illustrates a flowchart algorithm used to determine whether an error in the final critical dimension warrants a modification to the control input parameters of subsequent processes.

Turning now to FIG. 7, final critical dimension data is acquired and the error data associated with the final critical dimensions is calculated, as described in block 710. One exemplary method of calculating the final critical dimensions and the associated errors is described below. The error data is acquired from one of a plurality of methods known by those skilled in the art. Once the error data is acquired, a determination is made whether the error data is inside a deadband, as described in block 720 of FIG. 7. The step described in block 720 is performed to determine whether an error is sufficiently significant to warrant a change in the control inputs on the line 120. To define the deadband, the errors acquired from product analysis stations (not shown), such as a review station, are compared to a predetermined set of threshold parameters. In one embodiment, the deadband contains a range of error values associated with control input signals centered proximate to a set of corresponding predetermined target values, for which generally controller action is blocked. If any one of the errors acquired from the product analysis station is smaller than its corresponding predetermined threshold value, that particular error is deemed to be in the deadband. One of the primary purposes of the deadband is to prevent excessive control actions, resulting from changes to control input parameters on the line 120, from causing a semiconductor manufacturing process to be overly jittery.

When a determination is made, as shown in block 720, that an error corresponding to a control input signal is inside the deadband, that particular error is ignored, as described in 210 block 730 of FIG. 7. That is, when the value of an error that corresponds to a control input signal is found to be in the predetermined deadband, that particular error is not used to update its corresponding control input signal. In one embodiment, when the error data is determined to be inside the deadband, no changes to the control parameters are made based upon that particular error data, as described in block 730 of FIG. 7. New error data is then obtained and analyzed, as described in block 740 of FIG. 7. In one embodiment, the steps described above are repeated for the new error data that is obtained.

When a determination is made, as shown in block 720, that an error corresponding to a control input signal is not inside the deadband, further processing, such as modifying the control input parameters to compensate for the error, is performed, as described in block 750 of FIG. 7. The value of the error corresponding to a control input signal is used to update the control input parameters on the line 120 for a subsequent manufacturing process step.

Figure 8:
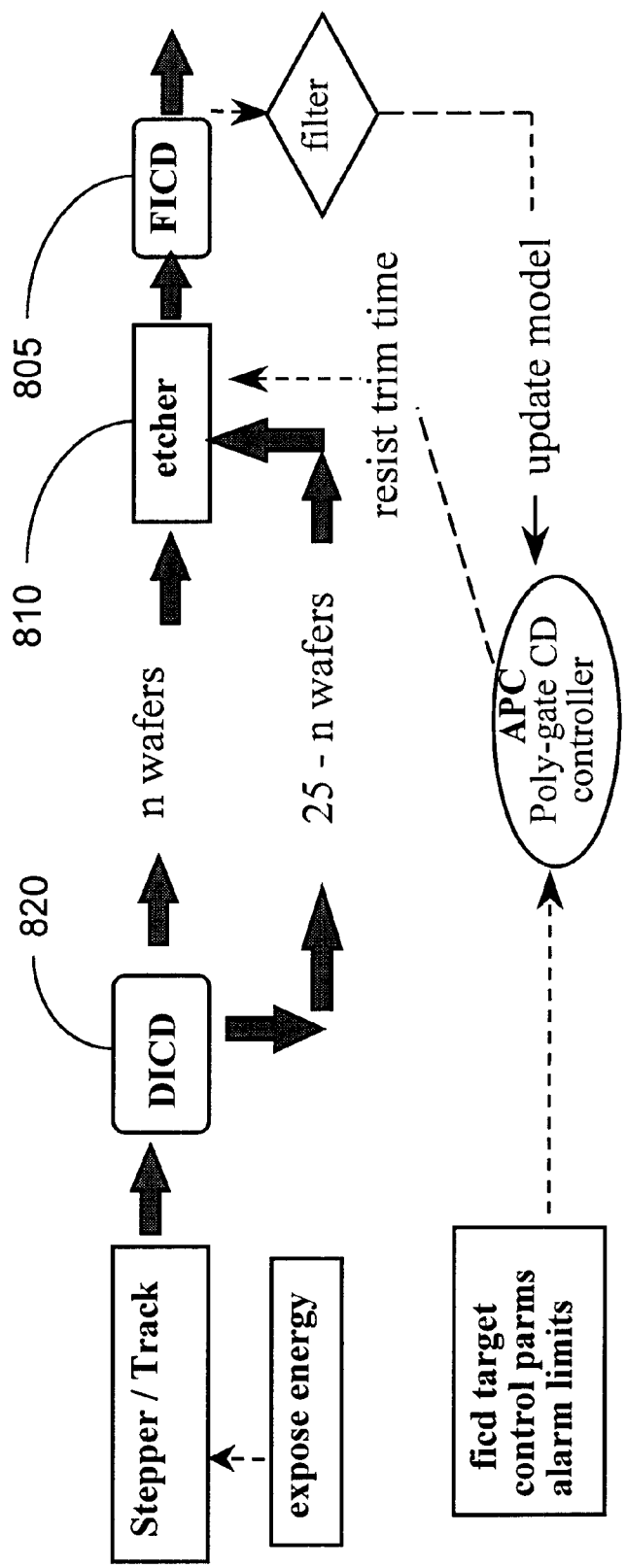
FIG. 8 illustrates a block diagram representation of a system for calculating final critical dimensions and associated errors, in accordance with one embodiment of the present invention.

Turning now to FIG. 8, one embodiment of calculating the final critical dimensions and the associated error data is illustrated. One embodiment of the control strategy of performing polysilicon gate (poly-gate) CD measurement for a photoresist etcher process is as follows. The control strategy for poly-gate CDs is illustrated in FIG. 8. The control "knob" that has been developed is an additional etch step before the standard poly-gate etch is run. This additional step is an etch of photoresist, with the result that the photoresist line-width is reduced. Increasing or decreasing resist etch time results in larger or smaller final inspection critical dimensions (FICDs 805). Since FICDs 805 can only be reduced by this method, incoming wafers must have larger than nominal DICDs 820. A reduction of current nominal photo-exposure places the normal range of poly CD variation above the target value. A sample set of "n" wafers is taken from the lot and sent ahead through the etcher 810. These send-ahead wafers receive a nominal photoresist etch time resulting from a characteristic resist trim time seen in previously processed lots. The sample wafers are stripped and the FICDs 805 are measured. A process controller, such as an APC controller, automatically reads these FICD 805 measurements. The process controller filters this data to reduce noise and determines the correct photoresist trim time to drive the remaining wafers in the lot to the FICD 805 target. The recipe is downloaded, the trim time is automatically adjusted, and the balance of the lot is etched at the new trim time. The process controller also determines whether or not send-ahead wafers from subsequent lots are required. With no send-ahead sample, the process controller uses the FICD 805 measurements from previously etched lots to update resist trim time.

The advantage of this control method is improved lot-average FICD 805 control, quantified below. In addition, manufacturability is improved because variations at both photo (e.g., track PM's) and etch (e.g., wet chamber cleans) are now automatically compensated by photoresist trim time, in contrast to the previous engineering-intensive control method of photolithography rework at a modified exposure dose.

The control algorithm is outlined here as it would apply to a series of lots of the same context, or "thread," arriving at poly-gate etch to be processed in the same chamber. The context for the lots includes product type as well as "quarantine" tags produced by step change events, such as maintenance actions, in photolithography.

The control model defines the relationship between the control variable, a conditioned FICD 805 (FICD_bar) measurement, and the manipulated variable of photoresist etch time.

This relationship is defined by a polynomial function (see Equation 1):

$$\text{FICD\_bar} = c - a*t^2 - b*t, \qquad \text{Equation 1}$$

where a and b are model parameters determined from experimental data and are part of the formal specification for this process. This formal specification is versioned and requires approval to change. These constants reside in the Recipe Management System (RMS), along with the process recipes and other parameters of the process specification. The variable t is the photoresist etch time, and c is a parameter that is adapted to the current state of the etch process.

At initialization, the process controller output is a fixed "default" value for resist etch time, $t_0$. This value resides in RMS along with the initial value of c and the FICD 805 target in accordance with the model equation (see Equation 2):

$$\text{FICD\_target} = c_0 a * t_0^2 - b * t_0 \qquad \text{Equation 2}$$

The initialization condition is termed a "Reset," a condition that may be invoked by operator entry or by automatic action. A Reset condition requires a send-ahead child lot of one or more sample wafers to be run at initial time $t_0$. No additional lots can be run before the FICDs 805 are measured for the initial child lot.

The FICD 805 data is conditioned to produce FICD_bar as described in the Measurement Estimation Algorithm section given below. The model is adapted to present operation by modifying the parameter c (see Equation 3):

$$c_1 = \text{FICD\_bar} - a*t_0^2 - b*t_0 \qquad \text{Equation 3}$$

The predicted time ti for the parent lot is determined by minimizing an error function given by Equation 4:

$$\text{error} = (\text{FICD\_target} - \text{FICD\_predicted})^2 \qquad \text{Equation 4}$$

over the discrete set of feasible resist etch times as determined by RMS values of tmin and tmax (see Equation 5):

$$t = [t\text{min}, t\text{min}+1, t\text{min}+2, \ldots t\text{max}]. \qquad \text{Equation 5}$$

FICD_predicted is defined by the model equation over the set of times t, using the updated parameter $c_1$ (Equation 6):

$$\text{FICD\_predicted} = c_1 - a*t^2 - b*t \qquad \text{Equation 6}$$

The parent lot is etched with resist etch time $t_1$, the resulting FICD_bar values are measured, the parameter c is updated, and a new etch time is produced for the next lot, with continuation of this iterative loop ad infinitum.

In one embodiment, FICDs 805 are measured by a critical dimension measuring tool known as Opal, at nine sites across the wafer. For a given context of product type, etch chamber, and quarantine tags, these FICD 805 measurements are conditioned to improve the estimation of true FICD 805 values.

In one embodiment, each set of nine measurements is examined for "outliers" by determining if any of the individual measurements lie outside a "normal" range of variation. This normal range can be determined by several different methods, with slightly varying results. In one embodiment, the "Box plot" method is used. In addition to outliers, zero values are discarded. The number of remaining measurements must be greater than an RMS value of min_good_measures. If remaining measurements are too few, an exception condition is generated. The median and standard deviation values from individual wafer data are determined. These values are compared to bounds for the median values and a maximum allowed value for the standard deviation. An exception condition is generated for values outside of these RMS-specified values. Similar bounds checking is performed for the average and range of the median FICD 805 values from each wafer of the sample set.

The resulting single value is FICD_avg, the average of wafer median FICD 805 measurements that characterize this lot of wafers. FICD_avg is now Exponentially-Weighted Moving Average (EWMA) filtered against the current EWMA average based on parent lot measurements (Equation 7):

$$FICD\_bar_{n+1} = \lambda \cdot FICD\_avg + (1-\lambda) \cdot FICD\_bar_n, \quad \text{Equation 7}$$

where lambda is a RMS specified value. This value, with the context of product type, etc., is sent to a process controller (not shown) to be used to determine photoresist etch time for the lot. Using the methods described above, the critical dimension measurements of processed semiconductor devices are performed.

Turning back to FIG. 4, once the final critical dimension measurements and error calculations are completed, modification data is calculated, using methods known to those skilled in the art and having the benefit of the present disclosure, which completes the step of performing the final critical dimension control adjustment process described in block 430. The modification data is then used to modify control input parameters on the line 120 and perform feedback and feed-forward for subsequent processing of semiconductor wafers, as described in block 440 of FIG. 4. In one embodiment, modifying a control input parameter comprises modifying a deposition time period to adjust a spacer width during a spacer deposition process. In addition to implementing the principles taught by the present invention for manufacturing of semiconductor wafers, the principles taught by the present invention can be utilized in other areas of manufacturing.

In one embodiment, control threads are utilized to control manufacturing processes. One method of using the updated control input signals on the line 120 is implemented by control threads. Control threads can be implemented by an overlay controller and an etching process tool. Control threads are a significant part of the control scheme of a semiconductor manufacturing tool such as the exposure tool. Each of the different control threads acts like a separate controller, and is differentiated by various process conditions. For overlay control, the control threads are separated by a combination of different conditions, including the semiconductor manufacturing tool (e.g., stepper) currently processing the wafer lot, the semiconductor product, the semiconductor manufacturing operation, and the semiconductor manufacturing tool that processes the semiconductor wafer lot at a previous layer of the wafer. Modifications to control threads are performed using the principles taught by the present invention.

The principles taught by the present invention can be implemented in an Advanced Process Control (APC) framework. The APC framework is a preferred platform from which to implement the final critical dimension control adjustment process strategy taught by the present invention. In some embodiments, the APC framework can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   processing a manufacturing run of semiconductor devices;
   acquiring metrology data from said processed semiconductor devices, said metrology data relating to a plurality of process steps;
   performing a final critical dimension control adjustment process using said acquired metrology data, wherein performing said final critical dimension control adjustment process further comprises correlating metrology data relating to said plurality of process steps; calculating a final critical dimension error based upon said metrology data based upon said correlation of metrology data, and modifying at least one control input parameter in response to calculating said final critical dimension error to approach a target critical dimension; and
   performing at least one of a feedback and a feed-forward modification process in response to said final critical dimension control adjustment process.

2. The method described in claim 1, wherein performing a process run of semiconductor devices further comprises processing semiconductor wafers.

3. The method described in claim 2, wherein processing semiconductor wafers further comprises:
   performing a metal deposition process on said semiconductor wafers;
   performing a photolithography process at a time period that is subsequent to said metal deposition process on said semiconductor wafers; and
   performing an etch process at a time period that is subsequent to said photolithography process on said semiconductor wafers; and
   acquiring metrology data further comprises:
   acquiring metrology data associated with each of said metal deposition process, said photolithography process, and said etch process.

4. The method of claim 3, wherein performing a final critical dimension control adjustment process further comprises:
   calculating a final critical dimension error data using said metrology data associated with each of said metal deposition process, said photolithography process, and said etch process;
   determining whether said final critical dimension error data is outside a deadband; and modifying at least one control input parameter based upon a determination that said final critical dimension error data is outside said deadband.

5. The method described in claim 1, wherein modifying at least one control input parameter further comprises modifying exposure dosages in a photolithography process.

6. The method described in claim 1, wherein modifying at least one control input parameter further comprises modifying exposure focus in a photolithography process.

7. The method described in claim 1, wherein modifying at least one control input parameter further comprises modifying the etch recipe in an etch process.

8. The method described in claim 1, wherein modifying at least one control input parameter farther comprises performing a feedback process upon an Advanced Process Controller (APC).

9. The method described in claim 1, wherein modifying at least one control input parameter further comprises performing a feed-forward process upon an Advanced Process Controller (APC).

10. A system for processing semiconductor wafers, comprising:
- a metal deposition process tool for depositing a metal substance upon a surface of a semiconductor wafer;
- a photolithography tool for defining metal lines upon said surface of said semiconductor wafer;
- an etch process tool for etching material resulting from processing of said semiconductor wafer by said photolithography tool;
- at least one machine interface electronically coupled to each of said metal deposition process tool, said photolithography tool, and said etch process tool, wherein said machine interface is for sending at least one control input parameter to each of said metal deposition process tool, said photolithography tool, and said etch process tool;
- a computer system electronically coupled to said machine interface, said computer system for controlling said machine interface;
- at least one metrology tool coupled with each of said metal deposition process tool, said photolithography tool, and said etch process tool, said metrology tool for acquiring metrology data from a semiconductor wafer processed by the metal deposition, photolithography, and etch process tools; and
- a final critical dimension control algorithm unit coupled with said metrology tool and said computer system, said final critical dimension control algorithm unit for causing said computer system to modify at least one control input parameter in response to calculating a final critical dimension error based upon correlation of metrology data relating to said metal deposition, photolithography, and etch processes, to generate at least one of a feedback and a feed-forward adjustment data to approach a target critical dimension.

11. The system of claim 10, wherein said final critical dimension control algorithm unit is integrated with said computer system.

12. An apparatus, comprising:
- a computer system;
- a manufacturing model coupled with said computer system, said manufacturing model for generating and modifying at least one control input parameter signal;
- a machine interface coupled with said manufacturing model, said machine interface for receiving process recipes from said manufacturing model;
- at least one processing tool for processing semiconductor wafers and coupled with said machine interface, said processing tool for receiving at least one control input parameter signal from said machine interface;
- a metrology tool coupled with said processing tool, said metrology tool for acquiring metrology data; and
- a final critical dimension control algorithm unit coupled with said metrology tool and said computer system, wherein said final critical dimension control algorithm unit is for calculating a final critical dimension error based upon metrology data relating to a plurality of process steps and for generating at least one of a feedback and a feed-forward adjustment data, based upon said final critical dimension error, to approach a target critical dimension.

13. The apparatus of claim 12, wherein said computer system for generating modification data for modifying at least one control input parameter.

14. The apparatus of claim 13, wherein said manufacturing model for modifying said control input parameter in response to said modification data.

15. An apparatus, comprising:
- means for processing a manufacturing run of semiconductor devices;
- means for acquiring metrology data from said processed semiconductor devices, said metrology data relating to a plurality of process steps;
- means for performing a final critical dimension control adjustment process using said acquired metrology data, wherein performing said final critical dimension control adjustment process further comprises correlating metrology data relating to said plurality of process steps; calculating a final critical dimension error based upon said metrology data based upon said correlation of metrology data, and modifying at least one control input parameter in response to calculating said final critical dimension error to approach a target critical dimension; and
- means for performing at least one of a feedback and a feed-forward modification process in response to said final critical dimension control adjustment process.

16. A computer readable program storage device encoded with instructions that, when executed by a computer, performs a method, comprising:
- processing a manufacturing run of semiconductor devices;
- acquiring metrology data from said processed semiconductor devices, said metrology data relating to a plurality of process steps;
- performing a final critical dimension control adjustment process using said acquired metrology data, wherein performing said final critical dimension control adjustment process further comprises correlating metrology data relating to said plurality of process steps; calculating a final critical dimension error based upon said metrology data based upon said correlation of metrology data, and modifying at least one control input parameter in response to calculating said final critical dimension error to approach a target critical dimension; and
- performing at least one of a feedback and a feed-forward modification process in response to said final critical dimension control adjustment process.

17. The computer readable program storage device encoded with instructions that, when executed by a computer, performs the method described in claim 16, wherein performing a process run of semiconductor devices further comprises processing semiconductor wafers.

18. The computer readable program storage device encoded with instructions that, when executed by a computer, performs the method described in claim 17, wherein processing semiconductor wafers and acquiring metrology data further comprises:

performing a metal deposition process on said semiconductor wafers;

performing a photolithography process at a time period that is subsequent to said metal deposition process on said semiconductor wafers;

performing an etch process at a time period that is subsequent to said photolithography process on said semiconductor wafers; and acquiring metrology data further comprises:

acquiring metrology data associated with each of said metal deposition process, said photolithography process, and said etch process.

19. The computer readable program storage device encoded with instructions that, when executed by a computer, performs the method of claim 18, wherein performing a final critical dimension control adjustment process further comprises:

calculating a final critical dimension error data using said metrology data associated with each of said metal deposition process, said photolithography process, and said etch process;

determining whether said final critical dimension error data is outside a deadband; and modifying at least one control input parameter based upon a determination that said final critical dimension error data is outside said deadband.

20. The computer readable program storage device encoded with instructions that, when executed by a computer, performs the method described in claim 16, wherein modifying at least one control input parameter further comprises modifying exposure dosages in a photolithography process.

21. The computer readable program storage device encoded with instructions that, when executed by a computer, performs the method described in claim 16, wherein modifying at least one control input parameter further comprises modifying exposure focus in a photolithography process.

22. The computer readable program storage device encoded with instructions that, when executed by a computer, performs the method described in claim 16, wherein modifying at least one control input parameter further comprises modifying the etch recipe in an etch process.

23. The computer readable program storage device encoded with instructions that, when executed by a computer, performs the method described in claim 16, wherein modifying at least one control input parameter further comprises performing a feedback process upon an Advanced Process Controller (APC).

24. The computer readable program storage device encoded wish instructions that, when executed by a computer, performs the method described in claim 16, wherein modifying at least one control input parameter further comprises modifying a deposition time period to adjust a spacer width during a spacer deposition processes.

25. The computer readable program storage device encoded with instructions that, when executed by a computer, performs the method described in claim 16, wherein modifying at least one control input parameter further comprises making adjustments to an ion implant dosage during an ion implant process.

26. The computer readable program storage device encoded with instructions that, when executed by a computer, performs the method described in claim 16, wherein modifying at least one control input parameter further comprises performing a feed-forward process upon an Advanced Process Controller (APC).

27. An apparatus for controlling a critical dimension, comprising:

a controller for correlating metrology data relating to a plurality of process steps and calculating a final critical dimension error based upon said correlated metrology data, and modifying a control input parameter in response to calculating said final critical dimension error to generate at least one of a feedback and a feed-forward adjustment data, based upon said final critical dimension error, to approach a target critical dimension.

28. The apparatus of claim 27, wherein said controller further comprising a final critical dimension control algorithm unit to calculate said final critical dimension error and said at least one of a feedback and a feed-forward adjustment data.

29. The method of claim 1, wherein calculating a final critical dimension error further comprises calculating an error relating to a metal critical dimension.

30. The method of claim 1, wherein performing said at least one of a feedback and a feed-forward modification process further comprises modifying an expose dosage relating to a photolithography process.

31. The method of claim 1, wherein performing said at least one of a feedback and a feed-forward modification process further comprises modifying an endpoint time relating to an etch process.

* * * * *